United States Patent [19]

Hino et al.

[11] Patent Number: 4,916,009

[45] Date of Patent: Apr. 10, 1990

[54] FLEXIBLE PRINTING BASE

[75] Inventors: Atsushi Hino; Yuzuru Noda, both of Osaka, Japan

[73] Assignee: Nitto Electric Industrial Co., Ltd., Osaka, Japan

[21] Appl. No.: 224,612

[22] Filed: Jul. 27, 1988

[51] Int. Cl.[4] .................................. B32B 15/08
[52] U.S. Cl. .................................. 428/220; 428/337; 428/339; 428/458; 428/473.5
[58] Field of Search .................. 428/423.5, 458, 220, 428/337, 339

[56] References Cited

U.S. PATENT DOCUMENTS 4,673,612  6/1987  Takagi et al. ............... 428/473.5 X
4,675,246  6/1987  Kundinger et al. .......... 428/473.5 X
4,792,476  12/1988  Numata et al. ............. 428/473.5 X Primary Examiner—Thomas J. Herbert
Attorney, Agent, or Firm—Sughrue, Mion, Zinn, Macpeak & Seas

[57] ABSTRACT

A flexible printing base comprising a metal foil having formed thereon a polyimide layer is disclosed, wherein said metal foil has a centerline average roughness of not more than 0.7 μm, and said polyimide mainly comprises a repeating unit represented by formula (I):

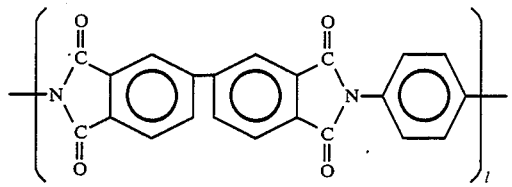

and a repeating unit represented by formula (II):

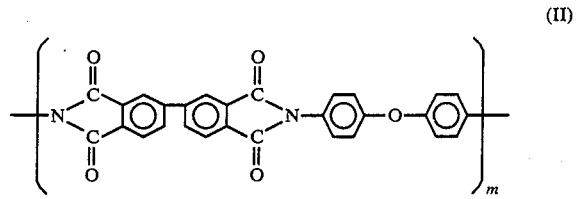

wherein $l:m = x:y$, wherein x represents a number not less than 45 and less than 70; y represents a number more than 30 and not more than 55; and $x+y=100$, said polyimide layer is formed by applying a solution of a polyamic acid mainly comprising a repeating unit represented by formula (III):

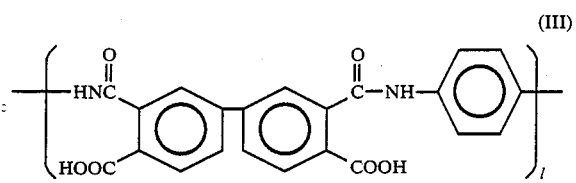

and a repeating unit represented by formula (IV):

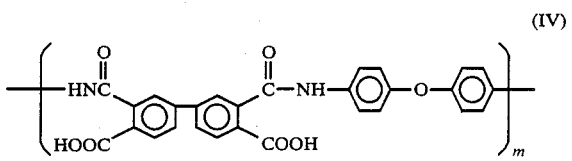

wherein l and m are as defined above, in N,N'-dimethylformamide and/or N,N'-dimethylacetamide on a metal foil, followed by imidation. The flexible printing base is quite free from curling either in the state of a composite laminate but also in the state where the metal foil has been removed by etching.

6 Claims, 2 Drawing Sheets

FLEXIBLE PRINTING BASE

FIELD OF THE INVENTION

This invention relates to a flexible printing base composed of a polyimide film and a metal foil which is free from curling either in the state as it is or after the metal foil is removed from the entire surface thereof by etching and is also excellent in characteristics, such as heat resistance, chemical resistance, and dimensional stability.

BACKGROUND OF THE INVENTION

A polyimide-metal foil composite laminate has been employed in semi-conductor devices as a base, of flexible printed circuit boards and the like. The flexible printed circuit board to which electronic parts, etc. are fixed is mounted in a semi-conductor device, etc. The recent demand for increasing a mounting density of a semi-conductor device has been satisfied by fixing electronic parts to the polyimide-metal foil composite laminate having a printed circuit at a high density by soldering on plural sites. Since the soldering is performed by melting a solder at a considerably high temperature, the polyimide-metal foil composite laminate to be used as a base is requested to have excellent characteristics including heat resistance. It is also requested from the standpoint of operation that the composite laminate remains flat without suffering warping during the stage not only before but after the circuit formation.

The above-described polyimide-metal foil composite laminate has been produced by (1) a process comprising adhering a polyimide film to a metal foil by using an adhesive, (2) a process comprising heat-fusing a polyimide film to a metal foil, and (3) a process comprising applying a solution of a polyimide or a precursor thereof in an organic polar solvent to a metal foil and heating the coating to form a polyimide film.

The first process using an adhesive is disadvantageous in that the overall heat resistance or heat shock resistance of the resulting composite laminate is reduced due to the action of the adhesive. In addition, this process requires previous film formation of polyimide, making the process time-consuming.

The second process is freed from the problems associated with the use of an adhesive as in the first process but still requires filming of polyimide in advance.

The third process involves no problem as described above and has an additional advantage that a polyimide-metal foil composite laminate having a small thickness can be obtained. However, this technique is disadvantageous in that the composite laminate either before or after etching of the metal foil, e.g., a copper foil, undergoes curling, which results in serious hinderance to workability. Such curling is believed to arise from the following causes. The curling occurring before etching is ascribed to a difference in coefficient of thermal expansion between a polyimide resin layer and a copper foil. That is, the difference in coefficient of thermal expansion produces a difference in shrinkage during the time after completion of heat-imidation through cooling to room temperature, thus causing curling. On the other hand, the curling after etching of the copper foil is ascribable to a difference in residual stress inside the polyimide resin layer. That is, during the imidation of the polyamide acid solution applied on the copper foil, one side of the resin layer comprising the polyamide acid is fixed to the copper foil with the other side open to air. As a result, there is produced a difference in the degree of drying and imidation between the side in contact with the copper foil and the opposite side in contact with air, which causes a difference in residual stress during cooling to room temperature. While the polyimide resin layer is supported by the copper foil in a composite structure, the residual stress, though surely existing, is compensated by rigidity possessed by the copper foil so that no curling takes place. However, the residual stress comes to cause curling upon removal of the copper foil by etching.

In order to solve the curling problem of a flexible printing base comprising the polyimide-metal foil composite laminate, it has been proposed to correct the curl by subjecting the composite laminate to post-treatment. For example, JP-A-54-31480 (the term "JP-A" as used herein means an "unexamined published Japanese Patent Application") discloses a process in which the composite laminate is stretched and rolled in an arched drier; JP-A-54-66966 discloses a process in which the composite laminate is heat-treated to remove the curl; JP-A-54-108272 discloses a process in which the composite laminate is wound around a cylinder with the resin layer facing outside and heat-treated at 100 to 200° C. for a long time to remove curling; and JP-A-59-22388 discloses a process in which the metal foil of the composite laminate is continuously brought into contact with a bar whose surface has a curvature radius of from 0.5 to 25 mm under tension to remove curling. These techniques fairly achieve correction of the curling but still present problems on practical application because an additional apparatus for the respective post-treatment is required, involving a so much extended processing step.

It has also been proposed to prevent curling by reacting a heat resistant resin with an epoxy resin, a phenoxy resin, or an acrylonitrile-butadiene copolymer to form a three-dimentional structure which is inhibited from shrinking on curing. According to this technique, prevention of curling can be achieved to some extent. However, the resin having a three-dimensional structure lacks flexibility and suffers from reduction of heat resistance due to a crosslinking agent introduced so that the resulting composite laminate exhibits deteriorated performance properties.

In recent years, an aromatic polyimide having a coefficient of thermal expension equal to or less than that of a copper foil has been developed. It has been confirmed that a flexible printing base (composite laminate) composed of such a polyimide layer and a metal foil undergoes substantially no curling as described in JP-A-60-32827. This flexible printing base, however, still undergoes curling in the state where the copper foil has been removed by etching. This is due to the difference in residual strain between the polyimide resin layer in contact with the copper foil and the other side. In other words, polyimide having such a small coefficient of thermal expansion as exhibited by a copper foil generally has a rigid molecular chain so that the internal stress is liable to remain without being relaxed.

The above-described proposals concern prevention of curling of a printing base having a metal foil. With respect to prevention of curling of a printing base from which the metal foil has been removed by etching, JP-A-5815579 discloses a process comprising casting a polyimide solution prepared by using a tetranuclear diamine on a metal foil. The flexible printing base prepared by this process does not suffer from curling even after the metal foil is etched off. This seems to be because the molecular chain of the polyimide has a folded structure, and the internal stress generated in the polyimide resin layer is properly relaxed by this folded structure and thus hardly remains. However, since polyimide having such a structure has a large coefficient of thermal expansion, it causes considerably large curling in the state where it is laminated with a copper foil.

As described above, any of the conventionally proposed processes has its own advantages and disadvantages, and the flexible printing base obtained undergoes curling either in the state of a composite laminate or after etching of the metal foil, leading to disorders in photoresist printing and the like as well as problems of handling, such as transportation.

Other recent proposals for overcoming these problems include a process in which an aromatic polyimide layer having, in the molecule thereof, a constituting unit for decreasing the coefficient of thermal expansion to the level of a copper foil and a constituting unit for relaxing the internal stress is formed on a copper foil, as disclosed in JP-A-58-190093 and JP-A-60-206639. However, the flexible printing base produced by this process still undergoes curling in any of the stage of a composite laminate and the stage after etching.

Hence, a flexible printing base which does not curl at all in any stage and also exhibits excellent characteristics, such as heat resistance, chemical resistance, dimensional stability, etc., has not yet been developed.

SUMMARY OF THE INVENTION

One object of this invention is to provide a flexible printing base which undergoes no curling either in the state of a composite laminate or in the state where a metal foil has been removed by etching and also exhibits excellent characteristics, such as heat resistance, chemical resistance, dimensional stability, and the like. It has now been found that the above object of this invention can be accomplished by a flexible printing base comprising a metal foil having formed thereon a polyimide layer, wherein said copper foil has a centerline average roughness of not more than 0.7 μm, and said polyimide mainly comprises a repeating unit represented by formula (I):

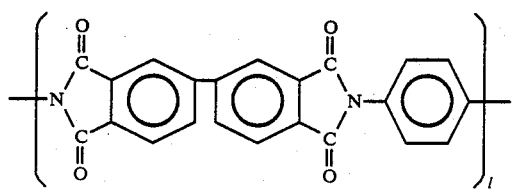

and a repeating unit represented by formula (II):

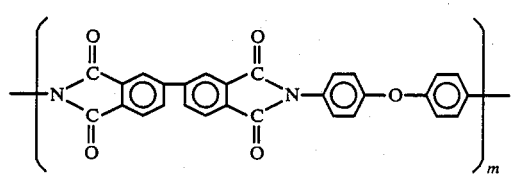

wherein $l : m = x : y$, wherein x represents a number not less than 45 and less than 70; y represents a number more than 30 and not more than 55; and $x + y = 100$, said polyamic layer is formed by applying a solution of a polyamic acid mainly comprising a repeating unit represented by formula (III):

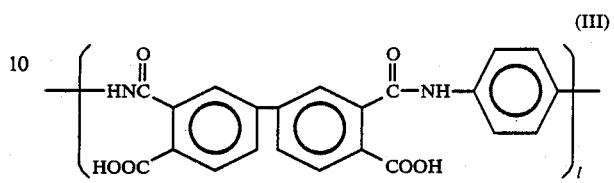

and a repeating unit represented by formula (IV):

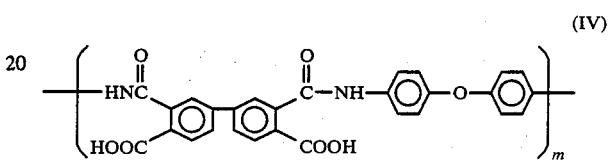

wherein l and m are as defined above, in N,N'-dimethylformamide and/or N,N'-dimethylacetamide on a metal foil, followed by imidation.

In an attempt to prevent curling of a flexible printing base, the inventors have paid their attention to a polyimide resin layer of the base and conducted extensive investigations chiefly on organic tetracarboxylic acid dianhydrides and diamino compounds, starting materials of polyimide. As a result, it has been found that polyimide having a coefficient of linear expansion equal to that of a metal foil can be obtained by starting with 3,3',4,4'-biphenyltetracarboxylic acid dianhydride or a derivative thereof as an organic tetracarboxylic acid dianhydride component and p-phenylenediamine as a diamino component and that a flexible printing base prepared by using this polyimide is free from curling. However, such an effect holds good only while the polyimide resin layer is in a laminate with a metal foil, and the problem of curling after removal of a metal foil remained unsolved.

As a result of further investigations, it has also been found that curling not only in the state of a composite laminate but in the state where the copper foil has been removed from the entire surface of the base can be reduced by using 4,4'-diaminophenyl ether in combination with p-phenylenediamine, the former being used at a molar ratio of more than 30 and up to 55 and the latter being used at a molar ratio of no less than 45 and less than 70, the sum of them being 100.

Since use of the above-described combination of diamino compounds is still insufficient to completely eliminate curling, the inventors furthermore continued their study with the aim of complete removal of curling after etching. As a result, they have found out that when a copper foil having a centerline surface roughness of not more than 0.7 μm is used, and at least one of N,N-dimethylformamide and N,N-dimethylacetamide is used as a solvent for the polyamic acid of formula (III) and (IV), there is obtained a flexible printing base quite free from curling not only in the state of a composite laminate but also in the state where a copper foil has been removed from the entire surface of the base. The present invention has thus been completed based on these findings. That is, the present invention first makes it possible to provide a flexible printing base which does not undergo curling at all not only in the state of a composite laminate but also in the state after removal of the copper foil by etching, thus producing great effects, such as a broadening of application of a flexible printing base.

DETAILED DESCRIPTION OF THE INVENTION

Figure 1:
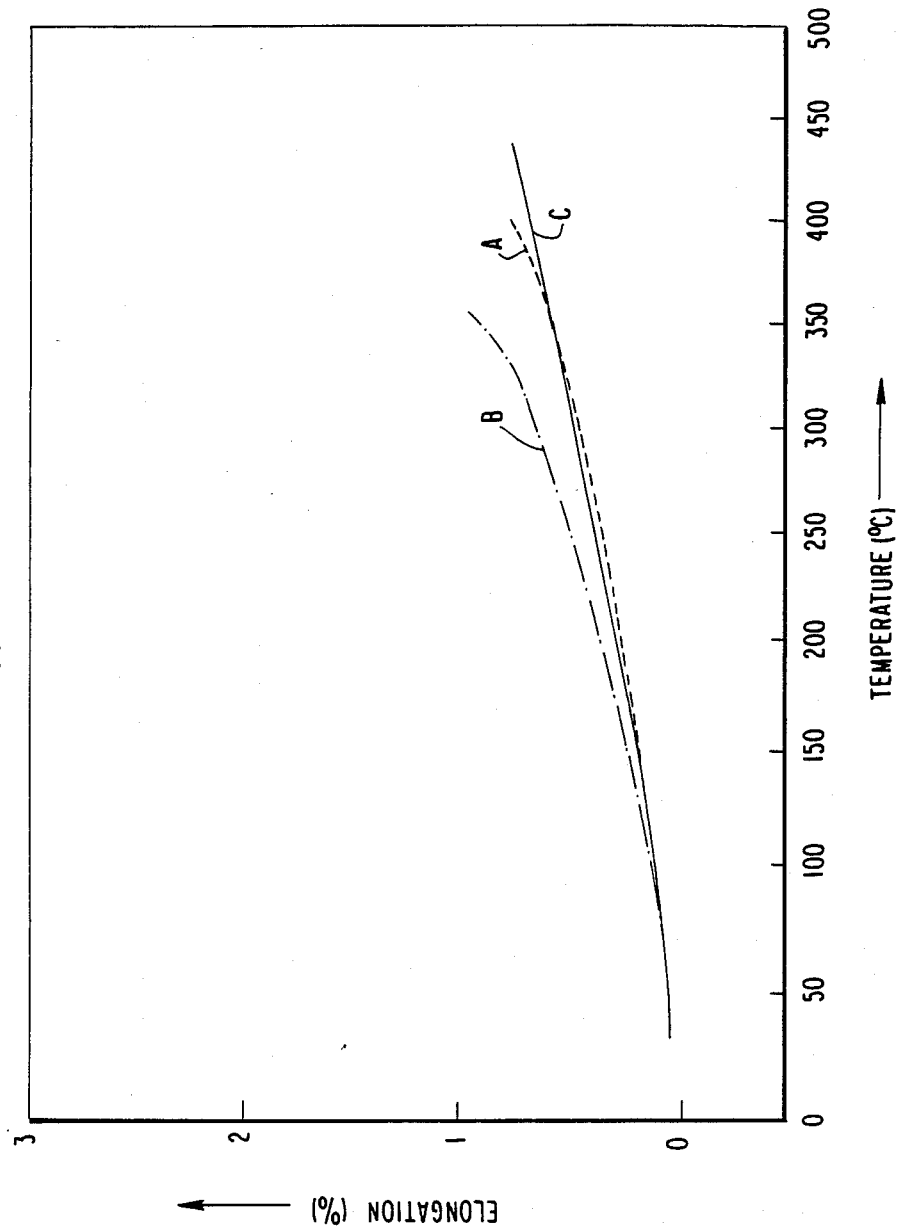
FIG. 1 shows TMA curves of polyimide films and a copper foil.

The polyimide resin in the flexible printing base of the present invention mainly comprises repeating units represented by formulae (I) and (II). The term "mainly comprise" includes the case where the polyimide resin consists entirely of the repeating units of formulae (I) and (II).

The reasons for accomplishing complete prevention of curling in both the state of a composite laminate and the state after etching are set forth below. (1) The polyimide resin has a coefficient of linear expansion approximate to that of a copper foil. (2) The repeating unit represented by formula (II) functions to relax stress generated during solvent removal, hydrating cyclization, and cooling to room temperature. (3) Uniform progress of imidation of the polyamic acid throughout the resin layer can be assured by selecting a solvent for the polyamic acid from N,N-dimethylformamide and N,N-dimethylacetamide. (4) The interface of the resin layer in contact with the copper foil has smoothness approximate to the opposite side open to air because of the above-specified small surface roughness of the copper foil in contact, thus making up the difference of residual stress between both sides of the resin layer, which would remove the difference of residual stress within the resin layer. It is not until all of these conditions are met that a flexible printing base quite free from curling in any state can be obtained. Should any one of these conditions be not fulfilled, the object of the present invention cannot be accomplished.

The polyamic acid mainly comprising the repeating units represented by formulae (III) and (IV) can be prepared, for example, by reacting a diamino component comprising not less than 45 mol % and less than 70 mol % of p-phenylenediamine represented by formula (V):

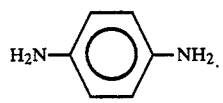
(V)

and not less than 30 mol % and up to 55 mol % of 4,4'-diaminodiphenyl ether represented by formula (VI):

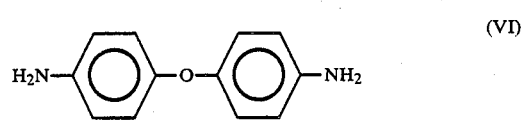
(VI)

and 3,3',4,4'-biphenyltetracarboxylic acid dianhydride or a derivative thereof in N,N-dimethylformamide and/or N,N-dimethylacetamide.

The above-recited molar ratio of p-phenylenediamine and 4,4'-diaminodiphenyl ether is essential. If the ratio of p-phenylenediamine is less than 45 mol %, the difference of coefficient of linear expansion between the copper foil and the polyimide resin layer becomes too large, causing curling in the stage of a composite laminate. On the other hand, if it is more than 70 mol %, not only is curling in the stage after etching of the copper foil fairly conspicuous, but curling to the opposite direction, i.e., with the copper foil side facing inside, becomes noticeable even in the laminated state.

As long as the molar ratio of p-phenylenediamine to diaminodiphenyl ether falls within the above-specified range, up to 10 mol % of the diaminodiphenyl ether may be replaced with diamino compounds other than the above-described diamino compounds. Such other diamino compounds include 2,2-bis[4-(4-aminophenoxy)phenyl]propane, 4,4'-bis(4-aminophenoxy)biphenyl, 4,4-bis[4-(4aminophenoxy)phenyl]ether, bis[4-(4-aminophenoxy)phenyl]sulfone, 1,4-bis(4-aminophenoxy)benzene, 1,3-bis(4-aminophenoxy)benzene, 1,3-bis(3-aminophenoxy)benzene, 1,4-bis(4-aminophenyl)benzene, bis[4-(4-aminophenoxy)phenyl] ether, bis(3-ethyl-4-aminophenyl)methane, bis(3-methyl-4-aminophenyl)methane, 3,3'-diaminodiphenylsulfone, 4,4'-diaminodiphenylsulfone, 3,3'-dimethyl-4,4'-diaminobiphenyl, 3,3'-dimethoxy-4,4'-diaminobiphenyl, 4,4'-diaminodiphenyl sulfide, 3,3'-diaminodphenyl ether, 3,4'-diaminodiphenyl ether, 3,4'-diaminodiphenylmethane, 1,5-diaminonaphthalene, 2,6-diaminonaphthalene, 4,4'-diaminobiphenyl, 2,4-diaminotoluene, 3,5-diaminobenzoic acid, m-phenylenediamine, and so on, either alone or in combinations thereof.

A part or the whole of these diamino compounds may be replaced with silicone diamine compounds shown below.

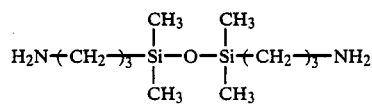

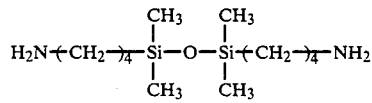

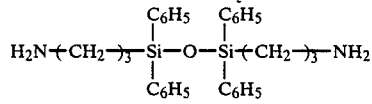

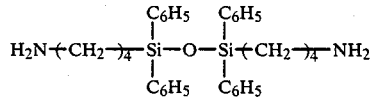

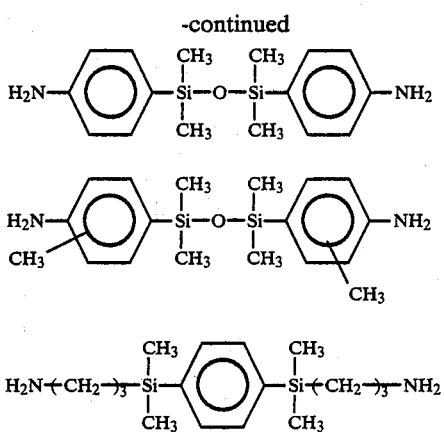

Use of these silicone diamine compounds is particularly effective to produce a highly heat-resistant flexible printing base in which the resin layer is firmly adhered to a metal foil. Such an excellent effect is attributed to the phenomenon found in the study on polyimide resins for use in printed circuit boards, in which a polyimide resin having incorporated in the molecule thereof a siloxane bond exhibits strong adhesion not only to silicon-containing bases, e.g., glass, but to a metal foil.

The tetracarboxylic acid dianhydride component to be reacted with the above-described diamino component mainly comprises 3,3',4,4'-biphenyltetracarboxylic acid dianhydride or its derivative including an acid halide, a diester, a monoester, etc. In general, it comprises 70 mol % or more of 3,3',4,4'-beiphenyltetracarboxylic acid dianhydride or its derivative and up to 30 mol % of other tetracarboxylic acid dianhydrides or derivatives thereof, e.g., acid halides, diesters, monoesters, etc. Too a small ratio of the 3,3',4,4'-biphenyltetracarboxylic acid dianhydride or its derivative results in a large difference in linear expansion coefficient between the metal foil and the polyimide resin or extreme reduction in strength of the polyimide resin.

Examples of the tetracarboxylic acid dianhydrides or derivatives thereof which may be used in combination with 3,3',4,4'-biphenyltetracarboxylic acid dianhydride or its derivative are pyromellitic dianhydride, 3,3',4,4'-benzophenonetetracarboxylic acid dianhydride, 2,3,6,7-naphthalenetetracarboxylic acid dianhydride, and derivatives of these acid dianhydrides, either alone or in combinations thereof. Of these preferred are pyromellitic dianhydride or its derivative and 3,3',4,4'-benzophenonetetracarboxylic acid dianhydride or its derivative. These tetracarboxylic acid dianhydride components hardly produce a polyimide resin layer excellent in strength on reacting with the diamino component, but give favorable effects on reduction of linear expansion coefficient of the polyimide resin layer in good agreement with the object of this invention.

The reaction between the diamino component and the tetracarboxylic acid dianhydride component can be carried out in an organic polar solvent usually at a temperature of from 0° to 90° C. for a period of from 1 to 24 hours to thereby form a polyimide precursor. The diamino component and the tetracarboxylic acid dianhydride component are used in nearly equimolecular quantities. The organic polar solvent to be employed should be selected from N,N-dimethylformamide, N,N-dimethylacetamide, and a mixture thereof. Other organic polar solvents may be used in a proportion up to 15% by weight based on the above-described solvents. Included in such other organic polar solvents are N-methyl-2-pyrrolidone, dimethyl sulfoxide, dimethylphosphoamide, etc. In addition, xylene, toluene, hexane, naphtha, etc. may also be employed in a small proportion.

The thus synthesized polyimide precursor preferably has an inherent viscosity ranging from 0.4 to 7.0, more preferably from 1.0 to 3.0, as measured in N,N-dimethylformamide at a concentration of 0.5 g/100 ml at 30° C. If the inherent viscosity is too small, the resulting polyimide resin layer has reduced mechanical strength, and if it is too large, workability in coating onto a metal foil is deteriorated.

The terminology "inherent viscosity" as used herein can be calculated from equation shown below:

$$\text{Inherent Viscosity } (\eta \text{inh}) = \frac{\ln(t_1/t_0)}{c}$$

wherein $t_1$ represents a time required for a polymer solution to fall through a capillary tube, by a given volume; $t_0$ represents a time required for a solvent to fall through the same capillary tube; and c represents a polymer concentration of the solution in terms of gram per 100 ml of the solution.

The time for falling can be measured by means of a capillary viscometer. It is well known that the above-defined inherent viscosity directly relates to the molecular weight of the polymer.

The flexible printing base according to the present invention can be produced by heating the thus prepared polyimide precursor solution to a temperature of 80° C. or lower to decrease its viscosity and cast-coating the heated solution onto a metal foil having a thickness of from 1 to 500 μm, preferably from 10 to 100 μm, more preferably from 15 to 75 μm, by an appropriate means, e.g., an applicator. If the metal foil thickness is less than 1 μm, not only is the effect to prevent curling lessened but difficulty on end use would arise. To the contrary, if it exceeds 500 μm, the resulting flexible printing base lacks softness and is unsuitable for use as an electrical circuit board, etc.

Copper foils commonly employed in flexible printing bases have one side thereof roughened in order to enhance adhesion to an insulating material, and copper foils having various degrees of surface roughness are available. The copper foil to be used in the present invention should be selected from among those having its one side roughened to a centerline average roughness (hereinafter referred to as Ra) of not more than 0.7 μm. The restriction on surface roughness of the copper foil is based on the finding reached by the inventors in their study, in which the curling after etching due to a difference in residual stress between both sides of the polyimide layer becomes greater according as the surface roughness of the copper foil becomes greater. The inventors have proved that the flexible printing base can be completely freed from curling even in the state after etching by the use of a copper foil having the above-specified small surface roughness combined with the use of the above-described specific solvents in the polyamide acid solution. The greatest feature of the present invention lies in this point.

The copper foil to be used may be a rolled copper foil or an electrolytic copper foil, and is preferably a rolled copper foil from the standpoint of cost. The copper, foil may or may not be subjected to surface roughening treatment as long as Ra is not more than 0.7 μm. A copper foil having been subjected to surface treatment with a silane coupling agent or an aluminum coupling agent, etc. is preferred from the standpoint of adhesion to the polyimide resin layer.

The centerline average roughness is the most common parameter representing surface roughness and is determined in accordance with JIS D0601 as follows. From a roughness curve is taken out an area of l in measured length in the direction of its center line. The roughness curve is represented by equation $y = f(x)$, taking the center line of the area as an X axis and the direction of longitudinal magnification a Y axis. Ra can be obtained from equation shown below and expressed in micron-meter (μm).

$$Ra = \frac{1}{l} \int_0^l |f(x)| dx$$

The length of the copper foil on which the polyimide precursor solution is applied is not particularly limited. The width of the copper foil is practically in the range of from about 20 to about 200 cm. The width outside this range is also employable. It is a matter of course that the resulting flexible printing base is cut to lengths in the final step for end use.

If necessary, the above-described polyimide precursor solution may further be diluted with an organic polar solvent, which may be the same as that used in the preceding polymerization reaction. It is preferable to adjust the polyimide precursor concentration in the solution in the range of from about 10 to about 30% by weight. If the polyimide precursor concentration is too low, the formed polyimide resin layer tends to have a rough surface. Too a high concentration, i.e., too a high viscosity, would result in deteriorated workability on coating. Accordingly, taking coating workability into consideration, the viscosity of the solution is preferably adjusted to 5000 poise or less at the time of coating under heating.

After application of the solution onto the copper foil, the laminate is heat-treated, with its copper foil being fixed, to form a polyimide resin layer. The heat treatment is usually performed by heating first at 100 to 230° C. for about 0.5 to about 4 hours to remove the solvent, and the temperature is then elevated up to 230° to 600° C. at which heating is continued for an additional time of from 1 minute to 6 hours, preferably at a temperature in the vicinity of the glass transition point of the produced polyimide, i.e., from 250° to 450° C., for 5 minutes to 6 hours, whereby the polyimide precursor is completely converted to polyimide and, at the same time, the solvent, is removed and the stress generated in the coating film upon imidation can be relaxed. There is thus obtained a flexible printing base composed of a metal foil having formed thereon a polyimide resin layer (polyimide film) in which the stress has been relaxed.

When the heat treatment for imidation and relaxation of stress is effected at a temperature lower than 230° C., there result not only incomplete imidation but also insufficient relaxation of stress, which ultimately leads to liability to curling. On the other hand, temperatures exceeding 600° C. result in decomposition of polyimide. It may be possible to effect solvent removal and imidation simultaneously by immersion in a mid solution of pyridine and acetic anhydride instead of the heat treatment. However, since the immersion treatment tends to cause a difference in residual stress as compared with the heat treatment, imidation is preferably carried out by the above-described heat treatment.

The polyimide film formed on the metal foil preferably has a thickness of from 5 to 200 μm, more preferably from 10 to 100 μm, most preferably from 15 to 75 μm. A film thickness less than 5 μm deteriorates film characteristics. A polyimide film having a thickness exceeding 200 μm is too rigid to be used in a polyimide-metal foil composite laminate.

The resulting polyimide film generally has an average coefficient of linear expansion in the range of from $1.0 \times 10^{-5}$ to $3.0 \times 10^{-5}/°$ C. in a temperature range of from 50° to 250° C. In some cases, a smaller average coefficient of linear expansion may be employable. The average coefficient of linear expansion of the metal foil in the same temperature range is from $1.5 \times 10^{-5}$ to $1.7 \times 10^{-5}/°$ C.

As described above, the average coefficient of linear expansion of the polyimide resin layer can be set on approximately the same level of that of the copper foil by using the above-specified polyimide composition. The main feature of the present invention consists in the use of at least one of N,N-dimethylformamide and N,N-dimethylacetamide as a polymerization solvent. As compared with N-methyl-2-pyrrolidone, that is the most commonly employed solvent for polyimide precursors, these specific solvents can make the coefficient of linear expansion smaller with the polymer composition being the same. In this connection, reference can be made to FIG. 1 illustrating a TMA (thermomechanical analysis) curve of a polyimide film prepared from a solution of the same polyamide acid in N,N-dimethylformamide or N-methyl-2-pyrrolidone (Curve A or B, respectively) in comparison with that of a copper foil (Curve C). The thermomechanical analysis of the polyimide film was conducted by fixing one end of a 25 mm long and 3 mm wide specimen of the polyimide film by a chuck, pulling the lower end by applying a load of 15 g/mm$^2$, the distance between two gage marks being set at 10 mm, while elevating the temperature at a rate of 10° C./min in a nitrogen atmosphere, and measuring the elongation of the specimen.

The terminology "coefficient of linear expansion" as used herein is a value expressed by $\Delta l/l$, wherein l is a length of a specimen; and $\Delta l$ is a change in length with temperature change by 1° C. The terminology "average coefficient of linear expansion" as used herein is an average of the coefficients of linear expansion determined within a given temperature range. These values can be read out from the above-described TMA curve.

As is apparent from FIG. 1, with the polyamide acid composition being the same, the polyimide prepared from a solution in N,N-dimethylformamide exhibits a smaller coefficient of linear expansion. This is presumably because N,N-dimethylformamide undergoes more uniform dissipation than N-methyl-2-pyrrolidone so that the amount of the residual solvent at the time of imidation is smaller in the case of the former than in the case of the latter. As a result, the molecular chains of the resulting polyimide would be packed at a higher density in the former case. This means that the content of the repeating unit of formula (II) which contributes to relaxation of stress of the polyimide resin layer can be increased by using N,N-dimethylformamide as compared with the case of using N-methyl-2-pyrrolidone, with the starting polyamic acid having such a composition that proceeds polyimide having a coefficient of linear expansion almost equal to that of a copper foil. Thus, the use of the specific solvents according to the present invention is very beneficial for elimination of curling in not only the state of a composite laminate but the state after removal of the copper foil by etching.

As stated above, the flexible printing base in accordance with the present invention is so constructed that the polyimide resin layer may have the equal coefficient of linear expansion to a copper foil and that the internal stress of the polyimide resin layer may be effectively relaxed. Owing to such construction combined with the restriction of the surface roughness of the copper foil to be used, the flexible printing base of the present invention is quite free from curling not only in the state of a composite laminate but also in the state where the metal foil has been removed from the entire surface of the base by etching.

Figure 2:
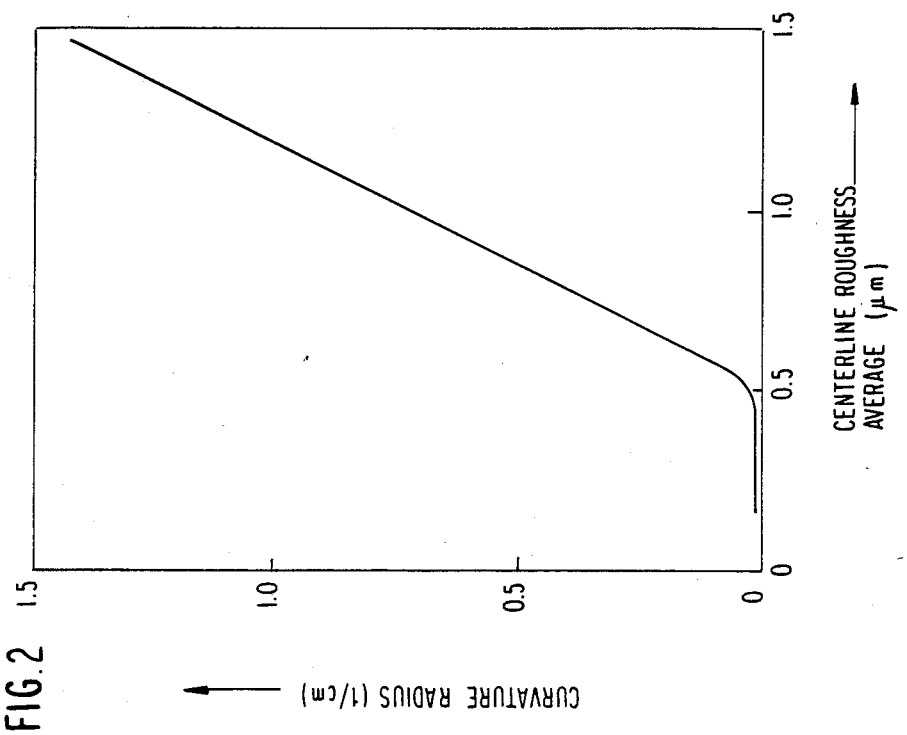
FIG. 2 is a graph depicting the relation between centerline roughness of a copper foil and the degree of curling of a polyimide film after etching of the copper foil.

FIG. 2 illustrates the relation between the degree of curling and the centerline average roughness of a copper foil in the state where the copper foil has been removed from the entire surface of the base. In FIG. 2, the ordinate is graduated in 1/curvature radius (1/cm). The higher the 1/curvature radius, the larger the degree of curling It can be seen from FIG. 2 that the degree of curling is lessened as the centerline average roughness becomes smaller.

Figure 3:
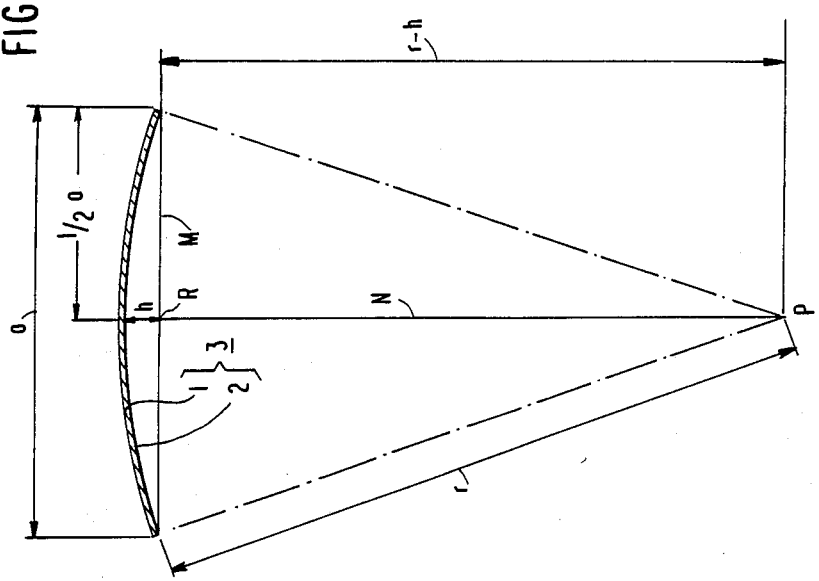
FIG. 3 is a diagram illustrating determination of a curvature radius of a curled flexible printing base.

The degree of curling can be quantitatively expressed in terms of curvature radius as depicted in FIG. 3. In FIG. 3, the numeral 3 indicates a square specimen of a flexible printing plate (10×10 cm) composed of metal foil 1 and polyimide film 2. The degree of curling in the longitudinal direction or width direction is expressed in terms of radius r from the center P. The curvature radius r is a found value when $h \geq r$, wherein h is a height from a point of intersection R of a horizontal line M connecting the both ends of a specimen and a line N perpendicular to line M drawn from the center P to the central point of the specimen. When $h \geq r$, the curvature radius r can be calculated, for the sake of convenience, from a length of the specimen in a curved state (a) and the above-defined height (h) according to equations shown below:

$$r^2 = (r-h)^2 + (\tfrac{1}{2}a)^2$$

$$r^2 = r^2 - 2rh + h^2 + \tfrac{1}{4}a^2$$

$$2rh = h^2 + \tfrac{1}{4}a^2$$

$$r = \tfrac{1}{2}h + \tfrac{1}{8}\cdot a/h^2$$

In the flexible printing base of the present invention, the metal foil is not limited to a copper foil and includes an aluminum foil and other metal foils.

Since the flexible printing base of the present invention does not undergo curling at all not only in the state of a composite laminate but in the state where the metal foil has been removed from the entire surface thereof by etching, it is broadly applicable to various uses. For example, it exhibits excellent effects when used in, for example, a tape carrier, a solar battery base, and a heat-resistant corrosion proof base.

The present invention is now illustrated in greater detail with reference to the following Examples and Comparative Examples, but it should be understood that the present invention is not deemed to be limited thereto.

EXAMPLE 1

To a 500 cc-volume flask equipped with a stirrer and a thermometer were charged 7.45 g (0.069 mol) of p-phenylenediamine (p-PDA), 6.2 g (0.031 mol) of 4,4'-diaminodiphenyl ether (4,4'-DDE), and 200 g of N,N-dimethylformamide (DMF), and the mixture was stirred to dissolve the diamino components.

To the mixture was added slowly 29.4 g (0.1 mol) of 3,3',4,4'-biphenyltetracarboxylic acid dianhydride (s-BPDA), followed by stirring at 30° C. or a lower temperature for 3 hours to prepare a 17.7 wt % polyimide precursor solution. The solution had an inherent viscosity of 1.94 (as determined in DMF, at a concentration of 0.5 g/100 ml at 30° C.) and a solution viscosity of 8600 poises (as determined at 30° C.).

The polyimide precursor solution was heated to 60° C., cast on a 35 $\mu$m thick copper foil having an Ra of 0.53 with an applicator, and dried at 100° C. for 30 minutes, at 200° C. for 1 hour, and then at 350° C. for 30 minutes to obtain a flexible printing base.

On cooling to room temperature, no curling was observed at all in the flexible printing base. When the copper foil was removed form the entire surface of the base by etching with a ferric chloride aqueous solution, no curling of the polyimide film was observed at all. The polyimide film was found to have an average coefficient of linear expansion of $1.65 \times 10^{-3}/°$ C. The adhesion between the polyimide resin layer and the copper foil was satisfactory. Further, when the flexible printing base was dipped in a soldering bath at 400° C. for 2 minutes and then allowed to cool to room temperature, neither curling nor separation between the polyimide layer and the copper foil occurred.

COMPARATIVE EXAMPLE 1

A flexible printing base was produced in the same manner as in Example 1, except for replacing DMF with N-methyl-2-pyrrolidone (NMP). The curvature radius of the resulting flexible printing base was 140 mm as measured in accordance with the method described above. After removing the copper foil by etching from the entire surface of the base in the same manner as in Example 1, the polyimide film had a curvature radius of 15 mm, and an average coefficient of linear expansion at 50° to 250° C. was $2.37 \times 10^{-5}/°$ C.

EXAMPLES 2 TO 7 AND COMPARATIVE EXAMPLES 2 TO 5

A flexible printing base was produced in the same manner as in Example 1 by using a copper foil having a centerline average roughness as shown in Table 1 below, and a diamino component, an aromatic tetracarboxylic acid dianhydride component and a polymerization solvent as shown in Table 1. The curvature radius of the resulting flexible printing base, curvature radius and coefficient of linear expansion of a polyimide film after etching are shown in Table 1. Table 1 also includes the results of Example 1 and Comparative Example 1. The abbreviations in Table 1 have the following meaning.

BAPP . . . 2,2-Bis[4-(4-aminophenoxy)phenyl]propane

DMAc . . . Dimethylacetamide

TABLE 1

| | Aromatic Tetra-carboxylic Acid Component (mol) | | Diamine Component (mol) | | Solvent | Ra (μm) | Polyimide Layer Thickness (μm) | Curvature Radius (mm) | | Coefficient of Linear Expansion (×10⁻⁵/°C.) |
|---|---|---|---|---|---|---|---|---|---|---|
| | | | | | | | | Flexible Printing Base | Polyimide Film | |
| Example No. | | | | | | | | | | |
| 1 | S-BPDA | (0.1) | p-PDA<br>4,4'-DDE | (0.069)<br>(0.031) | DMF | 0.53 | 21 | ∞ | ∞ | 1.65 |
| 2 | S-BPDA | (0.1) | p-PDA<br>4,4'-DDE | (0.069)<br>(0.031) | DMF | 0.53 | 65 | ∞ | ∞ | 1.68 |
| 3 | S-BPDA | (0.1) | p-PDA<br>4,4'-DDE | (0.055)<br>(0.045) | DMF | 0.53 | 19 | ∞ | ∞ | 2.12 |
| 4 | S-BPDA | (0.1) | p-PDA<br>4,4'-DDE | (0.045)<br>(0.055) | DMF | 0.53 | 21 | 150 | 200 | 2.80 |
| 5 | S-BPDA | (0.1) | p-PDA<br>4,4'-DDE | (0.069)<br>(0.031) | DMF | 0.29 | 25 | ∞ | ∞ | 1.61 |
| 6 | S-BPDA | (0.1) | p-PDA<br>4,4'-DDE | (0.069)<br>(0.031) | DMAc | 0.53 | 25 | ∞ | ∞ | 1.17 |
| 7 | S-BPDA | (0.1) | p-PDA<br>4,4'-DDE<br>silicone diamine* | (0.069)<br>(0.028)<br>(0.003) | DMF | 0.53 | 35 | ∞ | ∞ | 1.70 |
| Comparative Example | | | | | | | | | | |
| 1 | S-BPDA | (0.1) | p-PDA<br>4,4'-DDE | (0.069)<br>(0.031) | NMP | 0.53 | 25 | 140 | 15 | 2.37 |
| 2 | S-BPDA | (0.1) | p-PDA | (0.10) | DMF | 0.53 | 21 | −20 | 2 | 1.09 |
| 3 | S-BPDA | (0.1) | p-PDA<br>4,4'-DDE | (0.03)<br>(0.07) | DMF | 0.53 | 33 | 13 | ∞ | 3.88 |
| 4 | S-BPDA | (0.1) | p-PDA<br>4,4'-DDE | (0.069)<br>(0.031) | DMF | 1.23 | 22 | 141 | 8 | 1.70 |
| 5 | S-BPDA | (0.1) | BAPP | (0.10) | DMF | 0.53 | 40 | 12 | ∞ | 6.03 |

Note: Silicone diamine*

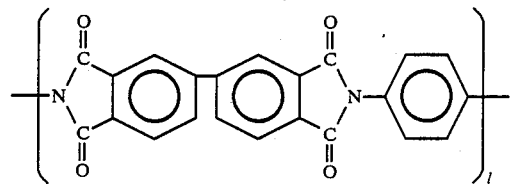

It can be seen from the results of Table 1 that the flexible printing bases according to the present invention are completely free from curling not only in the state of a composite laminate but also in the state where the metal foil has been removed by etching (i.e., in the state of a polyimide film only) as compared with the comparative samples.

While the invention has been described in detail and with reference to specific embodiments thereof, it will be apparent to one skilled in the art that various changes and modifications can be made therein without departing from the spirit and scope thereof.

What is claimed is:

1. A flexible printing base comprising a metal foil having formed thereon a polyimide layer, wherein said copper foil has a centerline average roughness of not more than 0.7 μm, and said polyimide mainly comprises a repeating unit represented by formula (I):

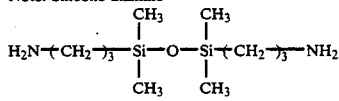

(I)

and a repeating unit represented by formula (II):

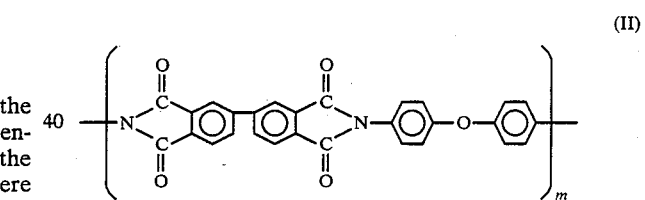

(II)

wherein $l : m = x : y$, wherein x represents a number not less than 45 and less than 70; y represents a number more than 30 and not more than 55; and $x + y = 100$, said polyimide layer is formed by applying a solution of a polyamic acid mainly comprising a repeating unit represented by formula (III):

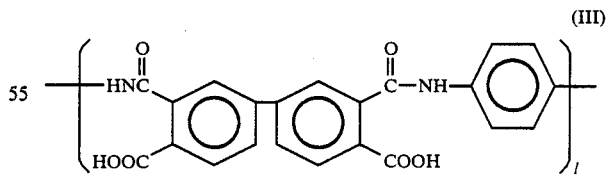

(III)

and a repeating unit represented by formula (IV):

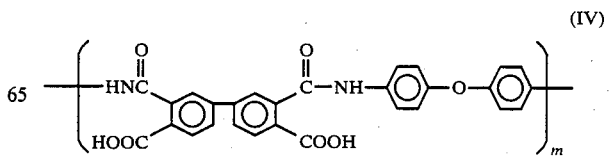

(IV)

wherein l and m are as defined above, in N,N'-dimethylformamide and/or N,N'-dimethylacetamide on a metal foil, followed by imidation.

2. A flexible, printing base as claimed in claim 1, wherein said polymeric acid solution has an inherent viscosity of from 0.4 to 7.0 as determined at a concentration of 0.5 g/100 ml in N,N-dimethylformamide at 30° C.

3. A flexible printing base as claimed in claim 1, wherein said metal foil has a thickness of from 1 to 500 μm.

4. A flexible printing base as claimed in claim 1, wherein said polyamic acid solution has a concentration of from 10 to 30% by weight.

5. A flexible printing base as claimed in claim 1, wherein said imidation is carried out by heating at a temperature of from 230° to 600° C.

6. A flexible printing base as claimed in claim 1, wherein said polyimide film has a thickness of from 5 to 200 μm.

* * * * *